(12) United States Patent
Bennett

(10) Patent No.: US 8,200,887 B2
(45) Date of Patent: Jun. 12, 2012

(54) MEMORY MANAGEMENT SYSTEM AND METHOD

(75) Inventor: Jon C. R. Bennett, Sudbury, MA (US)

(73) Assignee: Violin Memory, Inc., Mountain View, CA (US)

(*) Notice: Subject to any disclaimer, the term of this patent is extended or adjusted under 35 U.S.C. 154(b) by 513 days.

(21) Appl. No.: 12/079,364

(22) Filed: Mar. 26, 2008

(65) Prior Publication Data

US 2008/0250270 A1 Oct. 9, 2008

Related U.S. Application Data

(60) Provisional application No. 60/920,737, filed on Mar. 29, 2007.

(51) Int. Cl.
*G06F 12/00* (2006.01)

(52) U.S. Cl. . 711/103; 711/114; 711/169; 711/E12.079; 365/145

(58) Field of Classification Search .................. None
See application file for complete search history.

(56) References Cited

U.S. PATENT DOCUMENTS

| | | |
|---|---|---|
| 4,363,094 A | 12/1982 | Kaul et al. |
| 4,843,288 A | 6/1989 | Volz et al. |
| 5,128,810 A | 7/1992 | Halford |
| 5,379,262 A | 1/1995 | Okamoto et al. |
| 5,687,183 A | 11/1997 | Chesley |
| 5,974,503 A | 10/1999 | Venkatesh et al. |
| 6,009,547 A | 12/1999 | Jaquette et al. |
| 6,038,570 A | 3/2000 | Hitz |
| 6,118,612 A | 9/2000 | Judd et al. |
| 6,151,289 A | 11/2000 | Rope et al. |
| 6,185,134 B1 | 2/2001 | Tanaka |
| 6,226,708 B1 | 5/2001 | McGoldrick et al. |
| 6,237,052 B1 | 5/2001 | Stolowitz |
| 6,321,345 B1 | 11/2001 | Mann et al. |
| 6,353,895 B1 | 3/2002 | Stephenson |
| 6,374,337 B1 * | 4/2002 | Estakhri ........................ 711/169 |
| 6,425,052 B1 | 7/2002 | Hashemi |

(Continued)

FOREIGN PATENT DOCUMENTS

JP 09-265357 A 10/1997

OTHER PUBLICATIONS

NXP Corp., "LPC122x", datasheet, found at: "http://www.nxp.com/documents/data_sheet/LPC122X.pdf", p. 44 of 60.*

(Continued)

*Primary Examiner* — Kevin Ellis
*Assistant Examiner* — Arvind Talukdar
(74) *Attorney, Agent, or Firm* — Brinks Hofer Gilson & Lione

(57) ABSTRACT

A memory system and method of operating the same is described, where the memory system is used to store data in a RAIDed manner. The stored data may be retrieved, including the parity data so that the stored data is recovered when the first of either the stored data without the parity data, or the stored data from all but one memory module and the parity data, has been received. The writing of data, for low write data loads, is managed such that only one of the memory modules of a RAID stripe is being written to, or erased, during a time interval.

22 Claims, 11 Drawing Sheets

U.S. PATENT DOCUMENTS

| | | | |
|---|---|---|---|
| 6,539,463 B1 | 3/2003 | Kuwata | |
| 6,567,311 B2 | 5/2003 | Ishii et al. | |
| 6,591,339 B1 | 7/2003 | Horst et al. | |
| 7,111,140 B2 | 9/2006 | Estakhri et al. | |
| 7,149,950 B2 | 12/2006 | Spencer et al. | |
| 7,203,889 B2 | 4/2007 | Oza et al. | |
| 7,213,103 B2 | 5/2007 | Eng et al. | |
| 7,310,703 B2 | 12/2007 | Frolund | |
| 7,366,852 B2 | 4/2008 | Hung | |
| 7,734,867 B1* | 6/2010 | Keeton et al. | 711/114 |
| 7,984,084 B2 | 7/2011 | Sinclair | |
| 2002/0083379 A1 | 6/2002 | Nishikawa | |
| 2002/0103966 A1 | 8/2002 | Wu | |
| 2002/0120901 A1 | 8/2002 | Poirier et al. | |
| 2003/0046489 A1 | 3/2003 | Yagi et al. | |
| 2003/0084397 A1* | 5/2003 | Peleg | 714/770 |
| 2003/0097524 A1 | 5/2003 | Brant | |
| 2003/0105928 A1 | 6/2003 | Ash et al. | |
| 2003/0208511 A1 | 11/2003 | Earl et al. | |
| 2003/0212858 A1 | 11/2003 | Apperley et al. | |
| 2004/0073767 A1 | 4/2004 | Johnson et al. | |
| 2004/0153817 A1 | 8/2004 | Norman et al. | |
| 2004/0153902 A1 | 8/2004 | Machado et al. | |
| 2005/0044313 A1* | 2/2005 | Amemiya et al. | 711/114 |
| 2005/0111249 A1* | 5/2005 | Yagisawa et al. | 365/145 |
| 2005/0146939 A1 | 7/2005 | Conley et al. | |
| 2005/0193166 A1 | 9/2005 | Johnson et al. | |
| 2005/0223269 A1 | 10/2005 | Stolowitz | |
| 2005/0240743 A1 | 10/2005 | Eng et al. | |
| 2005/0246362 A1 | 11/2005 | Borland | |
| 2006/0161678 A1 | 7/2006 | Bopardikar | |
| 2006/0187715 A1 | 8/2006 | Narvaez et al. | |
| 2006/0271725 A1 | 11/2006 | Wong | |
| 2007/0061513 A1* | 3/2007 | Tsumagari et al. | 711/114 |
| 2007/0079219 A1 | 4/2007 | Nagai et al. | |
| 2007/0088754 A1 | 4/2007 | Brannon et al. | |
| 2007/0101075 A1 | 5/2007 | Jeddeloh | |
| 2007/0113029 A1 | 5/2007 | Bennett et al. | |
| 2007/0124532 A1 | 5/2007 | Bennett | |
| 2007/0162516 A1 | 7/2007 | Thiel et al. | |
| 2007/0279993 A1 | 12/2007 | Hemink | |
| 2008/0052446 A1 | 2/2008 | Lasser et al. | |
| 2008/0059869 A1 | 3/2008 | Brewer et al. | |
| 2008/0089135 A1 | 4/2008 | Ito | |
| 2008/0109616 A1 | 5/2008 | Taylor | |
| 2008/0168304 A1 | 7/2008 | Flynn et al. | |
| 2008/0183953 A1 | 7/2008 | Flynn et al. | |
| 2008/0250270 A1* | 10/2008 | Bennett | 714/6 |
| 2008/0282025 A1 | 11/2008 | Biswas | |
| 2008/0320366 A1 | 12/2008 | Lin | |
| 2009/0006886 A1 | 1/2009 | O'Connor et al. | |
| 2009/0010067 A1 | 1/2009 | Lee | |
| 2009/0089045 A1 | 4/2009 | Lenat | |
| 2009/0106491 A1 | 4/2009 | Piszczek et al. | |
| 2009/0147573 A1 | 6/2009 | Hemink | |
| 2009/0198947 A1 | 8/2009 | Khmelnitsky | |
| 2010/0023672 A1 | 1/2010 | Gorobets | |
| 2010/0115189 A1 | 5/2010 | Lin | |

OTHER PUBLICATIONS

Written Opinion of the International Searching Authority from the International Search Report from PCT application No. PCT/US2008/083969 dated Apr. 30, 2009, 5 pages.

International Search Report for International Application No. PCT/US2008/083969, dated Apr. 30, 2009, 3 pages.

Int$_e$l®, "Understanding the Flash Translation Layer (FTL) Specification," Dec. 1998, Order No. 297816-002, Copyright © Intel Corporation 1997, 1998, pp. 1-20.

Graefe, G., "Write-Optimized B-Trees," Proceedings of the 30$^{th}$ VLDB Conference, Toronto, Canada, 2004, pp. 672-683.

Jeffery, C.A., "Performance Analysis of Dynamic Sparing and Error Correction Techniques for Fault Tolerance in Nanoscale Memory Structures," Thesis Presentation to the University of Florida, 2004, 104 pages.

Juonolainen, M. K., "Cand Scient Thesis," University of Oslo, Jan. 2, 1999, 129 pages.

Norvag, K., et al., "Log-Only Temporal Object Storage," Copyright 1997 IEEE, published in the Proceedings of DEXA'97, Sep. 1-2, 1997, Toulouse, France, 6 pages.

Sanders, D.A., et al., "Terabyte IDE RAID-5 Disk Arrays," 2003 Conference for Computing in High Energy and Nuclear Physics, LaJolla, California, Mar. 24-28, 2003, pp. 1-8.

Shirriff, K.W., "Sawmill: A Logging File System for a High-Performance RAID Disk Array," Dissertation Presentation, University of California, 1995, pp. 164.

Violin Memory, Inc., "Spike Free Low Latency," obtained from Internet address: www.vmem.com, © 2011 Violin Memory, Inc., 8 pages.

Written Opinion of the International Searching Authority from the International Search Report for PCT Application No. PCT/2010/052074, 8 pages.

Response to Nov. 7, 2011 Final Office Action, U.S. Appl. No. 12/796,836, filed Dec. 20, 2011 (27 pages).

Written Opinion of the International Searching Authority from International Search Report for PCT application No. PCT/2010/052074 (8 pgs.).

Response to Nov. 7, 2011, Final Office Action, U.S. Appl. No. 12/796,836, filed Dec. 20, 2011 (23 pgs).

* cited by examiner

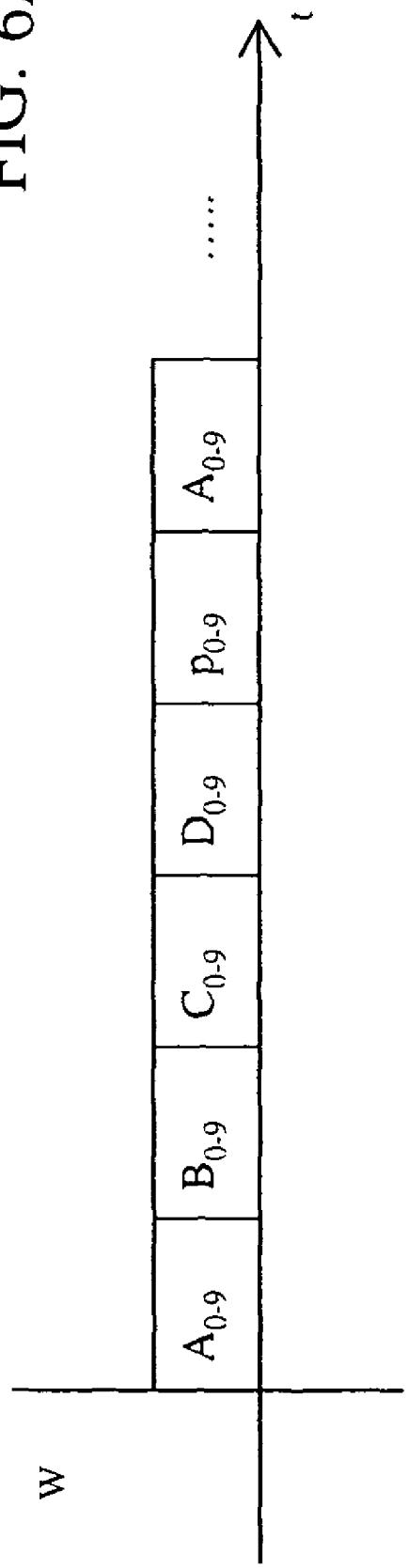

FIG. 6B

| T (Tn) | A | B | C | D | P |
|---|---|---|---|---|---|
| 1 | R | R | R | R | W |
| 2 | W | R | R | R | R |
| 3 | R | W | R | R | R |
| 4 | R | R | W | R | R |
| 5 | R | R | R | W | R |
| 6 | R | R | R | R | W |

MEMORY MANAGEMENT SYSTEM AND METHOD

This application claims the benefit of U.S. provisional application Ser. No. 60/920,737, filed on Mar. 29, 2007, which is incorporated herein by reference.

TECHNICAL FIELD

The present application relates to computer memory systems, and a method of using the same.

BACKGROUND

Computer memory systems may be either of the persistent or non-persistent type. Examples of persistent memory types are magnetic cores, disk drives, tape drives and semiconductor flash memories. Non-persistent memory types may be semiconductor memories such as DRAM or the like. Non-persistent memory types typically have rapid access times for both reading and writing of data and are used as computer main memory or cache memory. The data is retained in such memories by means which require a supply of power, and the information stored therein may be lost if the power is interrupted. Systems of non-persistent memory usually have a back-up power supply, which may be a capacitive storage device for short duration power interruptions, or back-up power supplies using batteries, generators, or the like for longer term data retention.

Persistent storage devices, such as disk, tape or flash memory retain stored data even if the power source is removed from the device, and are often used to back up the non-persistent data storage devices, and for longer term data storage where the cost or reliability of providing continuous power is not practical. Additionally, since larger amounts of data are stored in the persistent data storage devices, the technologies developed have been oriented towards the reduction of the cost per bit of storage, rather than access speed. Thus, many computing systems use a variety of memory types to perform the different functions, where immediately needed data is stored in non-persistent storage, and may be backed up in persistent storage, while less frequently accessed data, and large groupings of data are stored in persistent storage.

Computer data base systems, which may be termed data centers, or distributed data systems such as the Internet and the storage devices associated therewith may store vast amounts of data. Today, such data quantities may exceed 1000 Terabytes (TB), and are expected to continue to grow. Many of these data sets are substantially larger than the capability of non-persistent storage to immediately access, and the response time of the servers in a data center when servicing a request from a client computer may be a serious bottleneck in system performance. Much of this restriction is a result of the data access time latency of the persistent storage media. For tape systems, the linear tape must be translated so that the data portion to be read or written is positioned at the reading or writing heads. Similarly, for a disk, the head must be positioned so as to be over the data track where the desired sector of data is located, and then the disk controller waits until the sector rotates under the positioned head. Any of these operations is substantially slower than reading or writing to non-persistent memory devices. Such limitations are particularly severe where data single memory locations having a random location in the data base need to be read, written or modified.

The time between a request for data stored in a memory and the retrieval of data from the memory may be called the latency. Flash memories, amongst the presently used persistent memory technologies, has a lower latency than mechanical devices such as disks, but has significantly more latency than the non-persistent memory types in current use. The price of flash memory and similar solid state technologies has traditionally been governed by a principle known as Moore's Law, which expresses the general tendency for the capacity of a device to double, and the price to half, during an 18-month period. As such, the cost of storing data in flash memory rather than in, for example, a disk is expected to reach parity soon.

While having significantly lower latency than a disk device, flash memory remains limited in access time by the design and method of operation of currently available memory modules. Flash memory is a generic term, and a variety of types of solid state devices may be considered to be flash memory. Originally there was an electronically erasable programmable read only memory (EEPROM), followed by other developments, which are known as NOR-flash, NAND-flash, and the like. Each of the technologies has a different design and organization and differing attributes with respect to the reading and writing of data. That is, there may be a restriction on the minimum size of a block of data that may be either read or written (e.g., data word, page, or data sector), or a difference in the time necessary to read or to write data. In many instances, the time for reading or writing data is not deterministic, and may vary over a wide range. The memory controller, or other such device, must keep track of the outstanding requests until they are fulfilled, and this requirement makes the data latency a variable quantity which may slow down the overall system, and may increase the complexity of the hardware and software used to manage the memory. In addition, the lifetime of a flash memory device is considered to be subject to a wear out mechanism, and is measured in read, write (also called "program" when referring to FLASH memories) or erase cycles. Herein, the term "write" is used to mean "program" when a FLASH memory is being used.

Although the number of cycles in a lifetime may be large for each location or sector, a computation may be made to show that both in practice, and in pathological situations which may arise, the lifetime of individual components of large memories formed from flash devices is sufficiently short that considerable effort may be necessary to level the wear of the memory and to perform error detection and correction, mark bad data blocks, and the like.

The concept of RAID (Redundant Arrays of Independent (or Inexpensive) Disks) dates back at least as far as a paper written by David Patterson, Garth Gibson and Randy H. Katz in 1988. RAID allows disks memory systems to be arranged so to protect against the loss the data that they contain by adding redundancy. In a properly configured RAID architecture, the loss of any single disk will not interfere with the ability to access or reconstruct the stored data. The Mean Time Between Failure (MTBF) of the disk array without RAID will be equal to the MTBF of an individual drive, divided by the number of drives in the array, since the loss of any disk results in a loss of data. Because of this, the MTBF of an array of disk drives would be too low for many application requirements. However, disk arrays can be made fault-tolerant by redundantly storing information in various ways.

For example, RAID-3, RAID-4, and RAID-5 are all variations on a theme. The theme is parity-based RAID. Instead of keeping a full duplicate copy of the data as in RAID-1, the data is spread over several disks with an additional disk added. The data on the additional disk may be calculated (using Boolean XORs) based on the data on the other disks. If any singe disk in the set of disks is lost, the data stored on that disk can be recovered through calculations performed on the data on the remaining disks. These implementations are less expensive than RAID-1 because they do not require the 100% disk space overhead that RAID-1 requires. However, because the data on the disks is calculated, there are performance implications associated with writing, and with recovering data after a disk is lost. Many commercial implementations of parity RAID use cache memory to alleviate the performance issues.

In a RAID-4 disk array, there is a set of data disks, usually 4 or 5, plus one extra disk that is used to store the parity for the data on the other disks. Since all writes result in an update of the parity disk, that disk becomes a performance bottleneck slowing down all write activity to the entire array.

Fundamental to RAID is "striping", a method of concatenating multiple drives (memory units) into one logical storage unit. Striping involves partitioning storage space of each drive into "stripes" which may be as small as one sector (e.g., 512 bytes), or as large as several megabytes. These stripes are then interleaved so that the combined storage space is comprised of stripes from each drive in the stripe. The type of application environment, I/O or data intensive, is a design consideration that determines whether large or small stripes are used.

RAID-5 may be implemented using the same hardware configuration as RAID-4. In the case of RAID-4, the parity block is stored on the same disk for each of the stripes, so that one may have what is termed a parity disk. In the case of RAID-5, the parity block for each stripe is stored on a disk that is part of the stripe, but the parity blocks are distributed such that they are distributed essentially uniformly over the plurality of the disks making up the storage system. RAID-6 is another improvement in data protection which involves the computation of a parity across a plurality of stripes, for example using the columns of the stripes as the basis for computing the parity.

The performance of a RAID 4 array may be advantageous for reads (the same as level 0). Writes, however, require that parity data be updated each time. This slows small random writes, in particular, though large writes or sequential writes are fairly fast. Because only one drive in the array stores redundant data, the cost per megabyte of a RAID 4 array can be fairly low. The distribution of data across multiple disks can be managed by either dedicated hardware or by software. Additionally, there are hybrid RAID architectures that are partially software and partially hardware-based solutions.

Conceptually, the organization of data and error correction parity data is shown in FIG. 1, where the data in one block A is striped across three disks as data sets A1, A2 and A3, and a parity data set Ap is on the fourth disk, and where the parity data set Ap is typically computed as an exclusive-OR (XOR) of the data sets A1, A2, and A3. As is known to a person of skill in the art, any one of the data sets A1, A2, A3 or Ap may then be reconstructed from the other three data sets. Therefore an error in any of the data sets, representing, for example, a failure of one of the disks, may be corrected by the use of the other data sets.

An error-correcting code (ECC) is an algorithm in which each data signal conforms to specific rules of computation so that departures from this computation in the received or recovered\signal, which represent an error, can generally be automatically detected and corrected. ECC is used in computer data storage, for example in dynamic RAM, flash memories and the like, and in data transmission. Examples of ECC include Hamming code, BCH code, Reed-Solomon code, Reed-Muller code, binary Golay code, convolutional code, and turbo code. The simplest error correcting codes can correct single-bit errors and detect double-bit errors. Other codes can detect or correct multi-bit errors. ECC memory provides greater data accuracy and system uptime by protecting against errors in computer memory. Each data set A1, A2, A3, Ap of the striped data set may have an associated error correcting code ECC data set appended thereto and stored on the same disk. When the data is read from a disk, the integrity of the data is verified by the ECC and, depending on the ECC employed, one or more errors may be detected and corrected. In general, the detection and correction of multiple errors is a function of the ECC employed, and the selection of the ECC will depend on the level of data integrity required, the processing time, and other costs.

SUMMARY

A memory system is described including, including a plurality of memory modules, where each module may have a capability for writing and reading data. M bytes of data may be stored in a group of N memory modules of the plurality of memory modules. An error correcting code for the M bytes of data stored in the group of N memory modules may be stored in another one of memory module of the plurality of modules, or distributed amongst the modules. When the stored data is retrieved from any N−1 modules of the group of N memory modules and includes error correcting data, the M bytes of data stored in the group of N memory modules may be recovered.

In another aspect, a memory system includes a plurality of memory modules, each module may have a timing circuit, and the timing circuits are initialized at a same time, or have a known relationship to a reference time. A group K of the memory modules may be configured to store data blocks and a parity data block of the data blocks, and each of the K memory modules may be allocated a non-overlapping time interval in which data may be written to, or an erase operation performed on, one of the memory modules of the K memory modules.

In yet another aspect, a method of operating a memory system is described, the method including: providing a memory system having a plurality of memory modules; storing a stripe of M data blocks and a parity block memory modules of the plurality of memory modules; retrieving at least M of the data blocks or M−1 of the data blocks and parity data from the memory modules; and using a first received group of the M data blocks or the M−1 data blocks and the parity data, to represent the M data blocks.

In still another aspect, a computer program product is described. The product is stored or distributed on a computer readable medium, and includes instructions for managing the data of a memory system. The memory system may include a plurality of memory modules configured so that blocks of data and parity data computed from the blocks of stored data is stored on L different memory modules of the plurality modules. L−1 blocks of data and the parity data, or the stored blocks of data are retrieved, and either the retrieved L−1 blocks of data and the parity data, or the stored blocks of data, which ever is received earlier, is used to represent the stored blocks of data. Alternatively, the parity data may be associated with the stored blocks of data and distributed over L+1 memory modules, or the parity data may be stored on another memory module.

In a further aspect, a method of computing parity in a memory system includes disposing a plurality of memory modules in a tree, the tree having nodes. A data block from each of two nodes may be transmitted to a third node, the third node being closer to a root of the tree. A first parity block is computed from the received data blocks. A second parity block is computed using the first parity block and a data block stored at the third node to form a third parity block. The third parity block of each of two third nodes is transmitted to a node closer to the root as a data block. A fourth parity block is computed and stored, the fourth parity block being computed from the two third parity blocks and the data stored at the node closer to the root.

BRIEF DESCRIPTION OF THE DRAWINGS

FIG. 6A shows the time sequence of write operations for a RAID stripe;

FIG. 6B shows the relationship of write and read operations for sequential time intervals of FIG. 6A;

DETAILED DESCRIPTION

Figure 1:
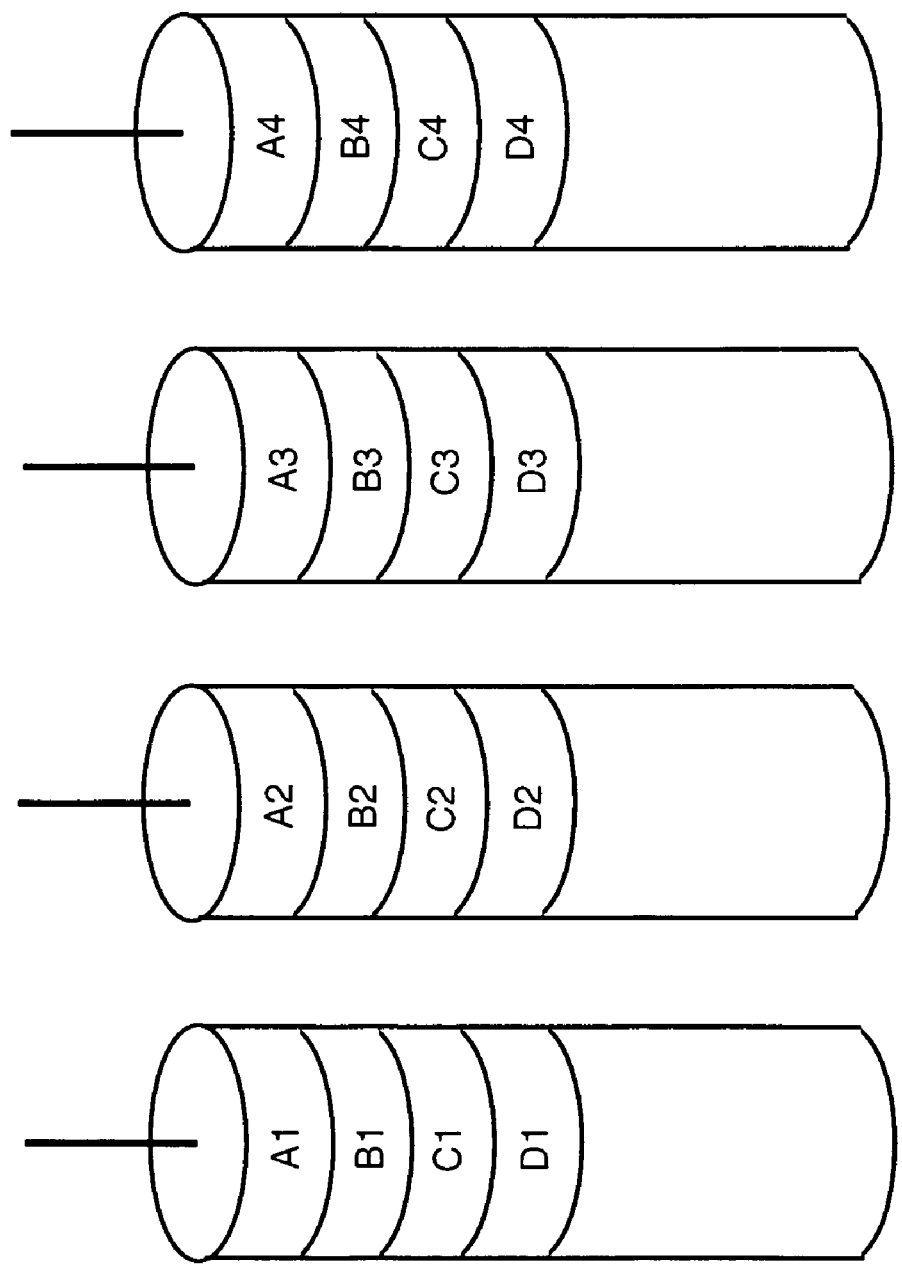
FIG. 1 illustrates a RAID 4 data storage system on a plurality of disk drives (prior art)

Exemplary embodiments may be better understood with reference to the drawings, but these embodiments are not intended to be of a limiting nature. Like numbered elements in the same or different drawings perform equivalent functions. Elements may be either numbered or designated by acronyms, or both, and the choice between the representation is made merely for clarity, so that an element designated by a numeral, and the same element designated by an acronym or alphanumeric indicator should not be distinguished on that basis.

It will be appreciated that the methods described and the apparatus shown in the figures may be configured or embodied in machine-executable instructions, e.g. software, or in hardware, or in a combination of both. The instructions can be used to cause a general-purpose computer, a special-purpose processor, such as a DSP or array processor, or the like, that is programmed with the instructions to perform the operations described. Alternatively, the operations might be performed by specific hardware components that contain hardwired logic or firmware instructions for performing the operations described, or by any combination of programmed computer components and custom hardware components, which may include analog circuits.

The methods may be provided, at least in part, as a computer program product that may include a machine-readable medium having stored thereon instructions which may be used to program a computer (or other electronic devices) to perform the methods. For the purposes of this specification, the terms "machine-readable medium" shall be taken to include any medium that is capable of storing or encoding a sequence of instructions or data for execution by a computing machine or special-purpose hardware and that may cause the machine or special purpose hardware to perform any one of the methodologies or functions of the present invention. The term "machine-readable medium" shall accordingly be taken include, but not be limited to, solid-state memories, optical and magnetic disks, magnetic memories, optical memories, and carrier wave signals. The description of a method as being performed by a computer should not preclude the same method being performed by a person.

For example, but not by way of limitation, a machine readable medium may include read-only memory (ROM); random access memory (RAM) of all types (e.g., S-RAM, D-RAM. P-RAM); programmable read only memory (PROM); electronically alterable read only memory (EPROM); magnetic random access memory; magnetic disk storage media; flash memory; or electrical, optical, acoustical data storage medium, or the like.

Often the data is stored in the form of a logical array as the data structure. However, the same logical array may be associated with a physical memory array having the same organization. Although the operation of many of the examples herein is described as if there were a direct correspondence between the logical data structure and the physical apparatus, this may not be the arrangement in practice, where the assignment of data to memory locations may be governed by the architecture of the memory system, the possibility of bad memory locations and the like. Such assignment of the data to physical locations may be performed by a file management system, such as the PCMCIA Flash Translation Layer FTL, or file systems such as the Linux Journaling Flash File System version 2 (JFFS2), the Aleph One Yet Another Flash File System (YAFFS), or storage-aware file systems such as the Sun ZFS (Sun Microsystems), and others which would be known to a person of ordinary skill in the art.

This relation between logical and physical addresses may be presumed when interpreting the examples described herein. The choice of one or the other for discussion is a matter of convenience and is not a restriction, unless specifically mentioned. As such, data stripes of a RAID organized memory may be mapped to any of the actual memory locations in the memory system. The constraints on the timing of erase, write and read operations should therefore be interpreted with respect to the data in a stripe, wherever such stripe is located in the memory system. That is, the terms memory module, memory location, data block and the like may generally be effectively used interchangeably.

Furthermore, it is common in the art to speak of software, in one form or another (e.g., program, procedure, process, application, module, algorithm or logic), as taking an action or causing a result. Such expressions are merely a convenient way of saying that execution of the software by a computer or equivalent device causes the processor of the computer or the equivalent device to perform an action or a produce a result, as is well known by persons skilled in the art.

When describing a particular example, the example may include a particular feature, structure, or characteristic, but every example may not necessarily include the particular feature, structure or characteristic. This should not be taken as a suggestion or implication that the features, structure or characteristics of two or more examples should not or could not be combined, except when such a combination is explicitly excluded. When a particular feature, structure, or characteristic is described in connection with an example, a person skilled in the art may give effect to such feature, structure or characteristic in connection with other examples, whether or not explicitly described.

A memory array may be constructed from memory elements other than disk drives. For example the memory array may be formed by a plurality of flash memory modules or other semiconductor memory devices.

In a first example, a RAID 4 architecture is used, without suggesting that other RAID architectures, or the like, are excluded. The choice of a RAID architecture is an engineering and economic decision based on such criteria as cost, reliability, latency for reading or writing, power consumption, data recovery speed, and the like. A person of skill in the art will understand that system and method shown in this example can be adapted to improve the performance of a RAIDed system in either reading data, writing data, or both.

Flash memories have a finite lifetime. The failure of flash memories may be broadly divided into the conventional failure mode which is associated with a defect in the construction which is either latent, or which develops by the passage of time, and which is considered typical of electronic components, and a wear-out mechanism. Typically the wear-out mechanism is related to the number of times a flash memory module is accessed, typically for an erase operation, although depending on the specific technology, reading or writing may be the wear-out mechanism. Although this is an electronic failure mechanism, one may consider it as more typical of a mechanical failure mechanism, such as is known as being due to the number of miles that a car has been driven. Both mechanisms may need to be considered in system design, and the overuse of a particular memory location avoided, by hardware or software management of the system operation.

When flash memory is used, the failure mechanism at wear out may be a single bit error in an array of data. Such a single bit error may ordinarily be detected and corrected by an error correcting code (ECC) associated with the data set in a particular memory module. The corrected data is then transmitted to the memory controller and combined with the data read from the other stripes to form the requested data set A. Since the data retrieved from stored data sets A1, A2, A3 does not have any errors, or the errors have been corrected by the ECC, the data from data set Ap is redundant. Only when one of the data sets A1, A2, A3 has a detected, but uncorrectable error, such as due to a memory module failure, is the data set Ap needed to correct the data of data set A. Such a multi-bit error would result, for example, if the memory module itself failed, and the data needed to be reconstructed using the remaining three data sets (the other three of the set A1, A2, A3, Ap). The occurrence of such an error type may be considered to be the electronic mean time between failure (MTBF) of a single memory module. Generally, only the data in the stripes A1, A2 and A3 is used, and the parity stripe Ap is retrieved and used only for the reconstruction of data when a failure occurs.

When a single bit error in the data stored in a memory module has been reported, a flash memory module may be considered to be unreliable, and the memory controller may "mark" or record the location of the memory module as being unusable, until such time as the memory module is replaced. Alternatively, a determined number of single-bit errors may be permitted to accumulate before a repair action is conducted.

The characteristics of some of the flash memory technologies may make the writing and reading of small blocks of data somewhat impractical, and a situation may arise where the size of the block to be written may be smaller than the minimum block size that the memory system is capable of writing. For example, a software system may segment files into block sizes of 512 bytes, however the minimum practical erase size for the memory system is 128 Kbytes. The four 512 byte blocks may be considered (when referring to the operating system, but 'sectors' to the FLASH) may be considered together make up a 2Kbyte page. The term "block" when used generically to refer to any type of data, including parity data, is not intended to connote a specific size in bytes or any other measure, and is use to refer to groups of data which may be associated with a particular description.

Where a RAID 4 system is used, the segments of the page, each comprising 512 bytes may be striped across four memory modules, while a fifth memory module is used for the parity data. In this example, the 512 byte block size, the use of 5 memory modules to store aspects of the block, and a minimum erase size of 128 Kbytes will be assumed, but it will be understood that these parameters are merely an example and not intended to suggest any particular limitation of the system or method.

Figure 2:
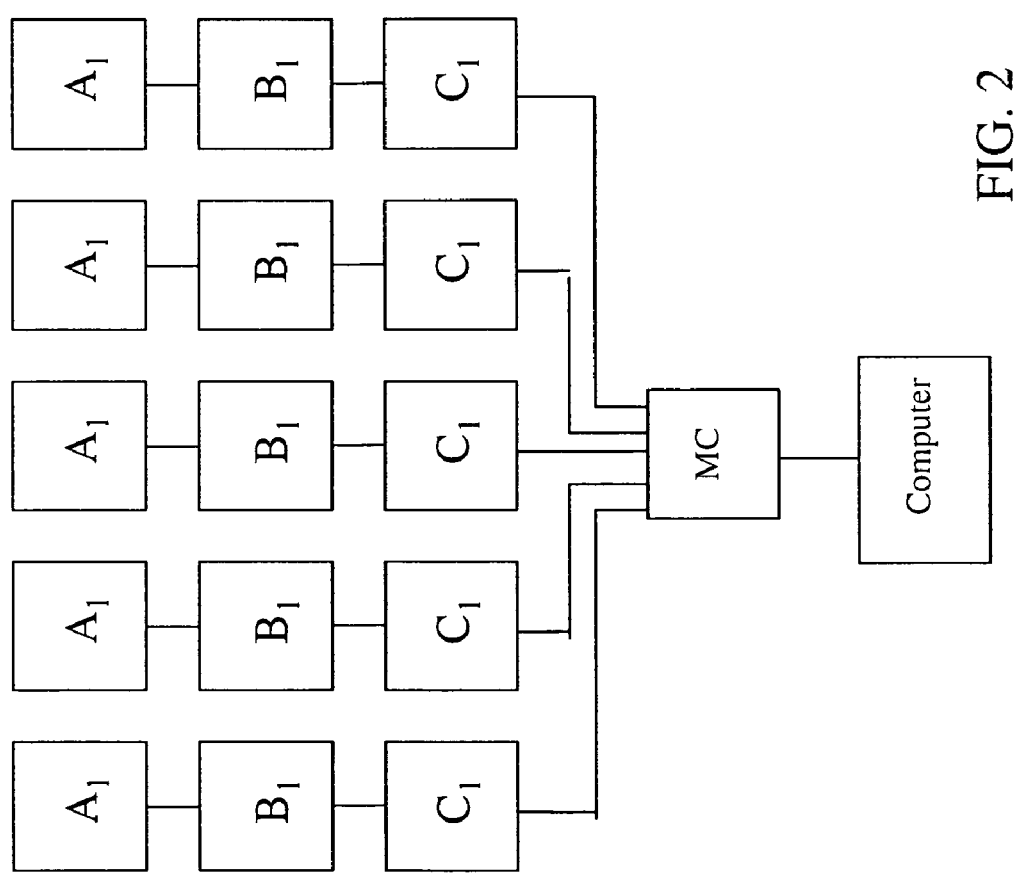
FIG. 2 illustrates a plurality of memory modules arranged in a row and column storage array.

FIG. 2 illustrates a memory system comprising a plurality of memory modules, the memory modules being connected to a memory controller through a bus. Each bus has a plurality of memory modules connected in a serial bus configuration, and has an organization which may be considered as comparable to that of a disk of the disk array of FIG. 1. In addition to being representative of a physical arrangement of memory modules, this arrangement may be considered as a logical address space for memory modules having a different physical organization.

Figure 3:
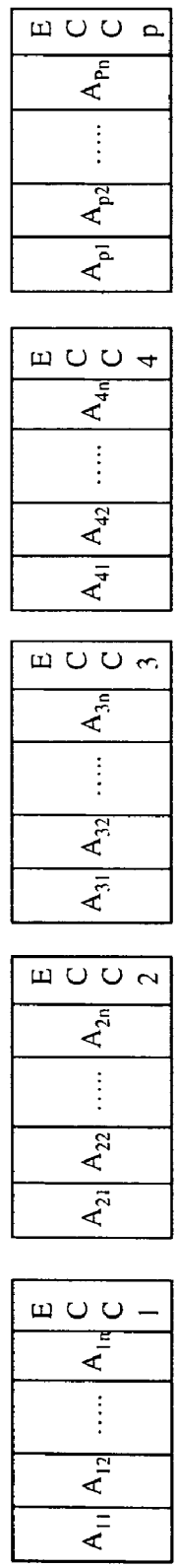
FIG. 3 is an example of a data structure for an array A stored on a plurality of memory modules.

FIG. 3 illustrates an organization of memory locations corresponding to the data array A, where the data array is considered to be the size of the minimum block size that may be written to the memory device. Each of the memory modules has a size 128 K bytes, made up of a plurality of memory sectors of size 512 bytes, and designated Amn, where m is the memory bus on which the memory module is located and n represents the individual memory locations associated with 512 byte sectors in each memory module write block. In this example, there are 256 sectors of 512 bytes in each 128 K byte erase block of the memory module.

A 512 byte data block may thus be written to sectors A11, A21, A31, A41, and the parity array Ap may be updated by computing an exclusive-OR on the data arrays A1, A2, A3, and A4. When writing the data to sectors A11, A21, A31 and A41, the data contained in, for example, sectors A12-A1n of memory module 0 is also written. This may arise as the data in data array A1 may need to be erased prior to recording changed or new data in sector A11. An example of this operation may include reading the data array A1 into a non-persistent memory device, erasing the memory associated with data array A1 in memory module 0, changing the data in sector A11 of the data of array A1 in memory module 0, and then writing the data of array A1 from the non-persistent memory to memory module 0. This represents an example of the operations which may be performed in the process of changing the data being stored in a flash memory. The usual housekeeping operations of a flash memory system will not be described herein. They may include checking for bad blocks, wear leveling, consolidating data to reclaim memory locations ("garbage collection"), error detection and correction, and the like. Such operations may be considered as overhead, and result in a reduction in the bandwidth of the system for reading or writing, and also increase the latency time. The operation of the flash memory in these examples is being described on a macroscopic level, where any internal operation that is substantially transparent to the user is presumed to occur without further description. However, when a restriction of a read or a write operation of the memory is asserted, the housekeeping operations generally conform to the restrictions on external reading or writing, but may be given priority in their execution, if necessary, during the time intervals where they are permitted. Internal operations, that may be needed to effect an external command, such as "read" or "write" may be performed during the periods allocated to read and write, even though such operations may be a combination of read and write internal operations.

In an example using presently available FLASH memory components, the data transfer inside the FLASH chip of 2 K bytes between the FLASH memory and the internal data register may take about 25 µsec for a read. Transferring 512 bytes of data from the internal register to the device controlling the FLASH may take about 20 µsec at a speed of 25 MB/s on the bus used to access the FLASH chip by a controller on the memory module, for a total time of about 45 µsec. However, the time to perform an erase of a 128 KB block of the FLASH so that new data can be written may take from about 1 msec to about 2 msec, which is about 20 to 40 times as long as the time to perform a read operation. Performing a program (write) operation of the FLASH can take about 20 µsec to transfer 512 bytes of data on the bus into the internal register of the FLASH chip and about 200 µsec to about 700 µsec to program the data into the FLASH memory, which is about 5 to 15 times as long as it takes to perform a read operation. Erasing a 128 K block and programming the 128 K block may take from about 13 msec to about 42 msec, or about 200 to 800 times as long as to perform a read operation. During the time period that the memory module is engaged in the erasing or programming (writing) operations, the memory module may not be able to perform other functions such as reading data from any of the other sectors A12 through A1n, if the data which is desired to be read resides on the same device of the module which is being erased or programmed. So, for a time period of the reading operations for what may be unrelated data also stored in the same memory array block A1 may be precluded when a write (program) operation is in progress when a read request is received. In many data base systems such a delay, which may be termed latency may not be desirable and may be unacceptable. The delay may become comparable to the delays encountered in disk storage media.

In a situation where the asymmetry between the read operation time and the write operation time for a data sector is intended to result in rapid reading of data, the action of writing a block of 2 K bytes, striped across 4 memory modules and a parity module, may result in a blockage of reading operations in which up to 10 K to 30 K of data could have been read during the latency period. Similarly, an erase operation could block the reading operations for about 80K to 160K of data.

This situation may be mitigated by an operation of the memory controller and memory modules so that the data is written in sectors of 512 bytes to each of the memory modules A1, A2, A3, A4 and Ap in sequence rather than in parallel. Thus, the write operation for array A1 is permitted to complete before starting the write operation for A2, and similarly, the write operation for A2 is permitted to complete before starting the write operation for A3. This continues until all of the memory modules in the stripe A, including the computation and writing of parity to module Ap is completed. During the time that each of the modules containing data arrays A1, A2, A3 and Ap is being written, the specific data array associated with the module cannot be read. However, in this example, only one of the modules A1, A2, A3, A3 and Ap may perform a write operation at any one time.

When a read command is issued for the 512 bytes of data stored in modules A11, A21, A31, A41 and Ap, each of the memory modules may receive the read request. Often, all of the memory modules are in a state where a read request may be promptly processed and the data returned to the memory controller. However, when a write command is being processed by a memory module, the data may not be readable from the memory module immediately, and thus one of the responses from data arrays A1, A2, A3, A4 or Ap may be substantially delayed. In the circumstance where the module Ap is used for data recovery purposes only, it is not read unless there is a memory failure. Since the memory management hardware or software expects to have responses from all of appropriate memory modules A1-A4, the completion of the response may delayed, if one or more of the memory modules is being written to, either due to an external command or housekeeping.

However, in the situation where there are 4 memory modules containing data, and one memory module containing parity data, only 4 of the 5 modules may need to return data in order that the desired data be read. That is, one of the data modules may be failed, or may report an unrecoverable error, or be blocked by a write or erase operation. For example, if the data module not returning data is A2, the remaining data modules may be A1, A3, A4 and Ap, in which case the desired 512 bytes have been retrieved. Where the missing data is from one of the modules, A1, A2, A3 and A4, the data from module Ap, being parity data, may be used to recover the data of the missing or delayed response module.

When the data stored in memory module A1 is read, for example, the data may verified using an error correcting code, whose data ECC1 may be stored in the same memory module as the data. If the data is correct, then no action need be taken. If an error is detected, the error may be corrected, the number of errors capable of being detected or corrected being a characteristic of the particular error correcting code being used. As returned to the memory controller, the data being read is either correct, or has been corrected by the ECC, or marked as being in error where the ECC has been able to detect the error(s), but not able to correct the error.

Typically, in a FLASH memory system, either a single error occurs due to the wear-out phenomenon, or the memory module has a larger-scale hardware failure which results in multiple errors of a type that can be detected by the memory controller. The memory module may be come inoperative.

In the situation where a single error is reported, but the error is corrected by the ECC, the occurrence of an error may be reported to the memory controller or other hardware or software used to manage the FLASH memory system, including on-chip memory management, and the memory module or a specific chip or data block may be marked as being defective, or monitored for further correctable errors. The memory management algorithm may determine that a memory module or chip may no longer be used for data storage. The data presently being stored in the memory module or chip will be moved to another memory location that is not marked as defective.

Alternatively, when an entire memory module is defective, for example due to a larger scale hardware failure, the data from one of the data arrays A1, A2, A3, A4 will be absent or determined to be in error. The data from the Ap may be used to reconstruct the data of the failed module, and the reconstructed data stored in a module that is not marked defective. The data integrity is thus maintained even when a large scale hardware failure occurs.

In the cases where the data is known to be correct, or had had an error corrected by the ECC, the desired 512 bytes of data may be available to the memory controller when the data from module containing arrays any four of the five memory modules A1, A2, A3 and A4 and Ap have been returned. For example, the data from memory modules A1, A2, A3 and A4 may be received. The data from the module containing Ap is then redundant as it is not needed either to determine the correctness of the data in the desired 512 bytes, or necessary to correct an error. In a situation where any one of the modules having the data arrays A1, A2, A3 or A4 does not return data, or returns data that is known to be incorrect or the data is delayed, the data from module Ap may be used to reconstruct the missing data, using the parity data in Ap and the remaining three data arrays. When the term "does not return data" is used, the criteria may be that the data is not returned within a particular time period, which would be typical of a read operation. The longer time to return data may be due to an interfering write or erase operation, or due to a hardware fault. The data from the module that "does not return data" may be either allowed to be returned at a later time, or the read operation for that module cancelled. In any event, the time to retrieve the data from a data stripe man not be prolonged by a module failing to return data within a reasonable time frame.

Hence, in an arrangement of memory modules, where one of the memory modules is used for redundant data (for example parity data), not all of the memory modules need return valid data before the requested data is available, or the data can be reconstructed. That is, for example, the requested data is available when the data from modules A1, A2, A3 and Ap has been read. Data from A4 is may not be needed.

A reason that the data from A4 may not be available, or not be available in a timely manner, is that data is being written to some sector of A4, or a sector is being erased, and this may delay the reading of data from the block being written. Data from 4 of the 5 memory modules are available at a time after receipt of a read request that is characteristic of the read time. The data from the $5^{th}$ module may be available in a timely manner, providing that a write operation is not in progress, but data from the $5^{th}$ module may be ignored, except in the case of an uncorrected error. When the data is substantially delayed, the delayed data is redundant data and may be ignored in the routine processing of the data in the memory controller.

As such, data from any 4 of the 5 memory modules in a stripe may be used to read the data stored in the stripe, with a low latency, since the reading of data 4 of the 5 modules is unimpeded by a write operation to the 4 of the 5 modules.

The process of managing memory in a memory system where the read and write times are asymmetrical, and the write time is substantially longer than the read time may include: writing the data to a plurality of memory modules, the memory modules being organized logically in a stripe pattern. Each of the memory modules may have an error correcting code with respect to the data in the memory module, and an additional memory module may have an error correcting code (e.g. XOR parity) with respect to the data in the plurality of modules. Write or erase operations may be performed by sequentially writing or erasing data to each of the memory modules, the writing or erasing operation to each successive module being delayed until the completion of the write operation to the pervious memory module. On completion of the write or erase operation to each of the memory module, the redundant data in the additional module is updated so that the data integrity is maintained. Thus only one memory module at a time is in a write state. Alternatively, the redundant data is updated in a non-persistent storage until the writing or erasing of the data containing modules is completed, and the data is then written to the additional module.

When write or erase operations are conducted to memory modules in a stripe in a sequential manner, only one of the memory modules in the stripe is blocked from reading data immediately in response to a read request and, in this example, at least 4 of the 5 memory modules will promptly return data to the memory controller. This is sufficient to complete the read operation. As such, the read operation is not delayed by a write or erase operation, although the overall speed of write or erase operations is reduced, since only one module may be in a write or erase state at a time. The substantially non-overlapping periods of time for the writing of the data to memory modules minimizes the conflicts between reading and writing operations for a data stripe.

The memory controller may wait a period of time for the read operation to complete, and then use the at least 4 of the 5 responses to assemble the requested data sector, being the data or the reconstructed data. Should all 5 of the data block be returned, either one data block may be ignored, or the redundant data be used as an additional error detection step, depending on the level of data confidence desired in the design.

The writing of data may be a priority in an initial population of an array of data, and the data may be written to a plurality of memory modules in a stripe in parallel. In these circumstances, the reading of data may be delayed as previously described, however this may be acceptable when initializing large arrays or moving large blocks of data. In the present example, the data writing speed is about 20 percent of the maximum writing speed as each of the 5 memory modules is written sequentially, while the read speed is no longer than approximately the expected read speed for a single module, since 4 of the 5 memory modules need to respond for a successful read, and they are blocked by the write. This blockage may be managed as the write load increases.

Figure 4A:
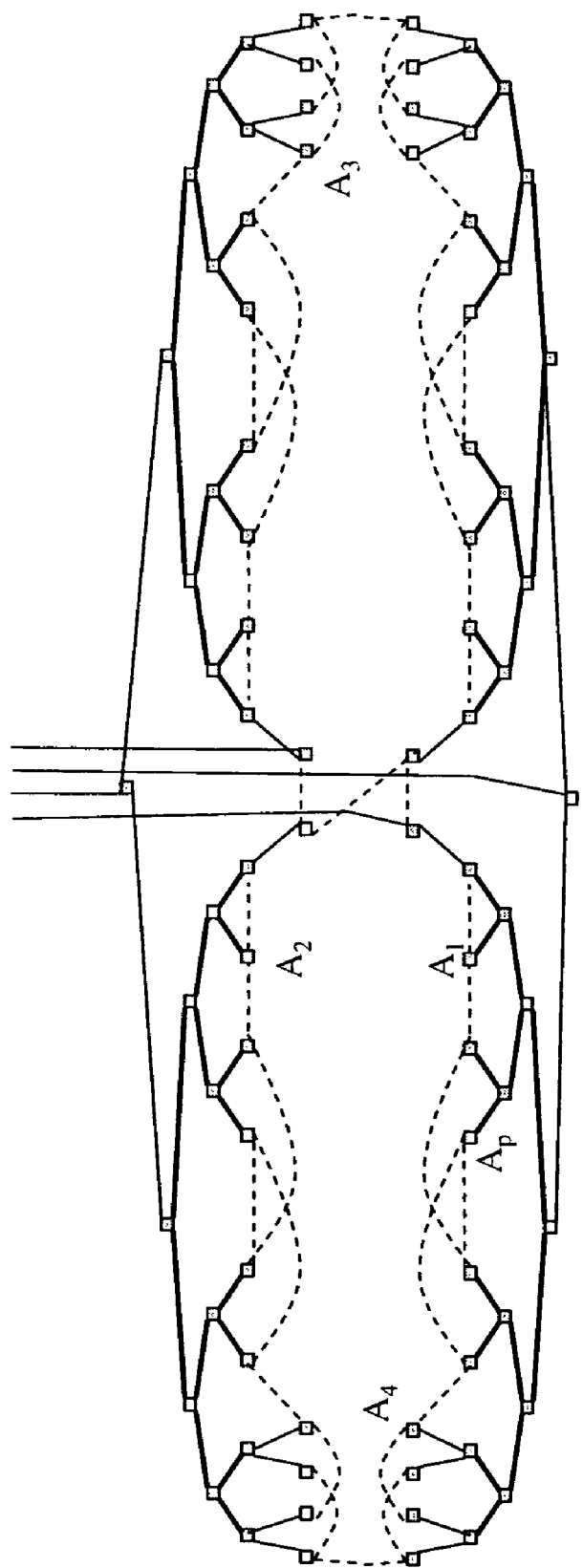
FIG. 4A illustrates an arrangement of memory modules arranged in a tree architecture, where the memory modules in a logical data stripe are located at leaves at the end of branches.

In another example, the organization of the memory array may be other than a row and column matrix as in the previous example. The row and column designation of the data described above may be understood as a logical address and the logical address mapped to a physical address. In the memory architecture of FIG. 4, the memory modules are organized in a tree, as taught by the present inventor in U.S. patent application Ser. No. 11/405,083, filed on Apr. 17, 2006, entitled "Interconnection System", and which is incorporated herein by reference. In the arrangement of the present example, tree-like structures are interconnected and have external connections to one or more memory controllers. An attribute of the tree system as shown in FIG. 4A is that any of the memory modules (shown by the square boxes) may be accessed by at least one of the memory controllers, even if one of the memory modules has completely failed, if any of the physical links had been broken, or if one of the memory controllers had failed. As such, the individual memory modules M may be assigned to data arrays A, without detailed regard to the physical position of the memory module in the system. (In this example, the memory module designations M are replaced with the associated data array designations A, for simplicity) The tree architecture may be adapted to contain a large number of memory modules, each module being relatively near to a root, in terms of the distance that signals may have to travel, when compared with linear architectures having a similar number of memory modules and memory controllers.

As an illustration, the data arrays A are shown in one example of an assignment to physical modules of the memory system of FIG. 4A, it being understood that this is one of a large number of possible assignments. The assignment of data arrays to memory modules may be changed to account for the failure of one or more memory modules without having a significant affect on latency time or other performance measures. An attribute of a tree memory system with a redundant interconnection architecture is that individual memory modules may be replaced while the memory system is in operation. This may be termed "hot swapping"

Figure 4B:
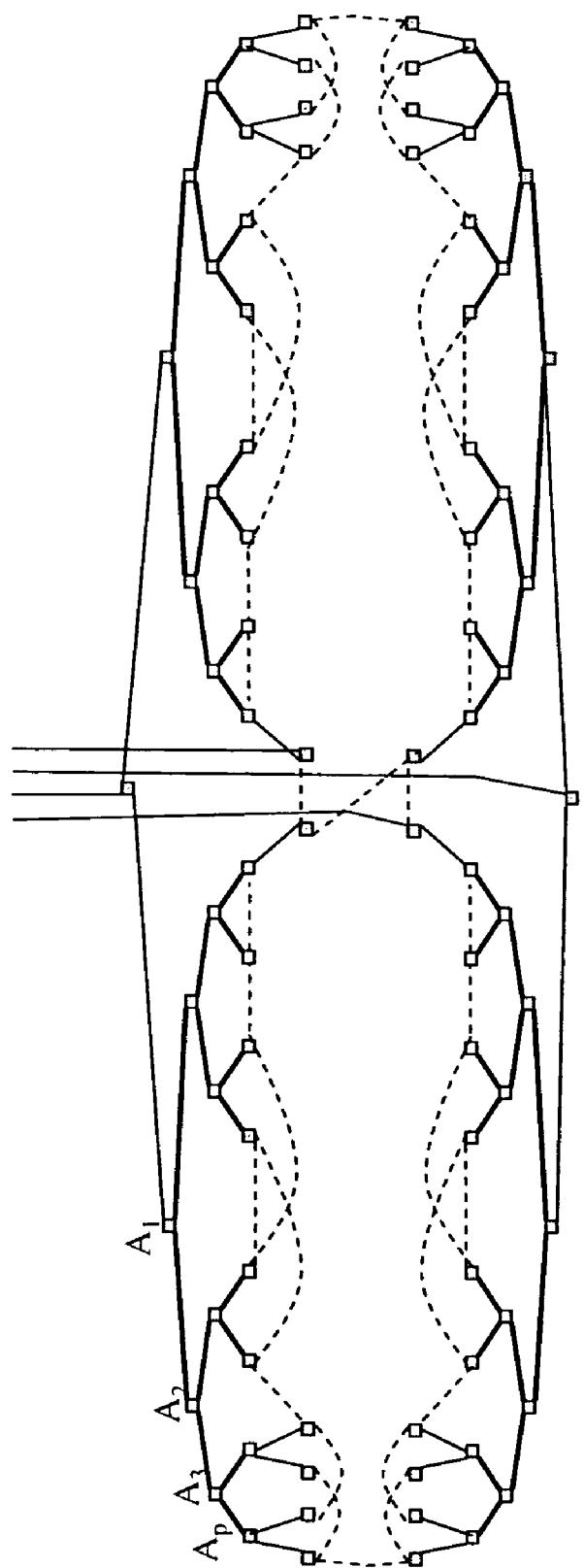
FIG. 4B illustrates an arrangement of memory module as in FIG. 4A, where the memory modules in a logical data stripe are located in a branch.

FIG. 4B illustrates another possible assignment of the data arrays A1, A2, A3, A4 and Ap to different physical memory modules in the memory architecture of FIG. 4A. Here, the modules are selected to be close to each other, and using the same, or part of the same data path between the memory modules and one of the memory controllers. Should either the memory controller or one of the memory modules fail, the alternative paths (some of which are shown as dashed lines) would be used to connect the memory modules to the original controller or an alternative controller. As such, the association of a logical representation of the data array A with a physical memory module is flexible. Re-designating any part of the data array A with respect to the location in the memory system is a change to the logical-to-physical mapping and data routing, and is usually limited only by the availability of a physical memory module and not by the location of the memory module in the memory system.

When a memory module fails and needs to be replaced, the possibility exists that a second failure may occur during the time period. The failure mechanism of a memory module may be divided into a wear-out mechanism and a conventional electronic circuit mechanism. The latter is dependent on the total time of operation, and the former is dependent on the usage of the memory module. Wear-out failure is gradual, with a correctable single bit failure as the initial failure. In such a case, the probability of a second module failing while the first module is being replaced may be estimated to be of the order of the inverse of the MTBF of the memory system, divided by the number of hours required to replace the failed memory. Similarly, if the cause is electrical, then the wear-out failure is unlikely to cause a failure during the short time that is required to replace a failed memory module, and the probability of a second failure is similarly small. As the system is RAID 4, loss of data occurs if two of the memory modules of the 5 memory module containing an array of data occurs.

The error mechanism of FLASH memories is such that a wear-out phenomenon occurs resulting in an error state. The wear out mechanism may differ between the various types of FLASH memories and the manufacturing technologies used by individual manufacturers. However, as the wear out of the FLASH memory results in equipment failure, system down time, and possible loss of data integrity, and variety of strategies for managing the wear of flash memories have been developed. Often the number of write or erase cycles of each block of data is recorded, and as the number of write cycles increases, data may be moved from a high usage area to a low usage area so as to extend the lifetime of the memory module. The characteristic failure mode of a FLASH memory module due to wear out, is that a single bit will be in error. That bit will tend to remain as an error in repeated read operations, until a second bit also exhibits an error. Since the error correcting codes (ECC) that may be used have the capability of detecting and correcting a single error and detecting, but not correcting a double error, the memory module may continue to be used until a two bit error occurs. When a two bit error is encountered, the redundant parity data is needed to reconstruct the desired data. Thus, alternative system management policies may be used.

In a first policy, the memory module is marked as unusable when a single bit error is encountered. Since the single bit error is corrected by the ECC associated with the memory module, the redundant data (for example the parity data) associated with the stripe need not be used. Since only 4 of the 5 modules of the previous example would suffice to represent the desired data, and the read operation is not delayed by waiting for the completion of a write operation. Alternatively, the memory module may continue to be used until a second bit error is detected in the data array of a memory module. In this circumstance the redundant data may used to reconstruct the data, if the error occurred in a memory module other than that containing the redundant data.

Once a bit position in a memory module has suffered wear out, the state of the bit in the failed bit position does not change. That is, if the bit was expected to be a logical 1, and it has failed to a logical 0, the bit continues to retain the failed state of logical zero. The failure of a bit position containing a logical 0 data bit would not be detected immediately, as the bit indicated by the failed location is the same as the expected value, logical zero. However, when the data stored in the bit position is changed, and the new data was a logical 1, the bit position will indicate that the data is logical 0, and the error will finally be detected and corrected. In such a circumstance, the ECC associated with the memory module may correct the data read from the memory module, but as the bit position is a failed location, the actual value of the data in that location cannot be changed. However, the correct value of the bit in the failed bit location may be determined by reconstructing the data using the parity information in another memory module. Where this is done, the actual location of the failed bit location may be determined, and a correction to that location may be stored separately, and be applied when two errors are detected by the ECC, so as to further extend the life of the flash memory module. The information on the location of failed memory locations may be stored in the ECC area, by increasing the size of the ECC, and a small number of failed bits may be corrected prior to applying the ECC.

When compared with a disk system, a solid state memory system may access data arrays stored in a plurality of memory modules with substantially less interference between read and write or erase operations or between multiple operations of the same type.

Figure 5:
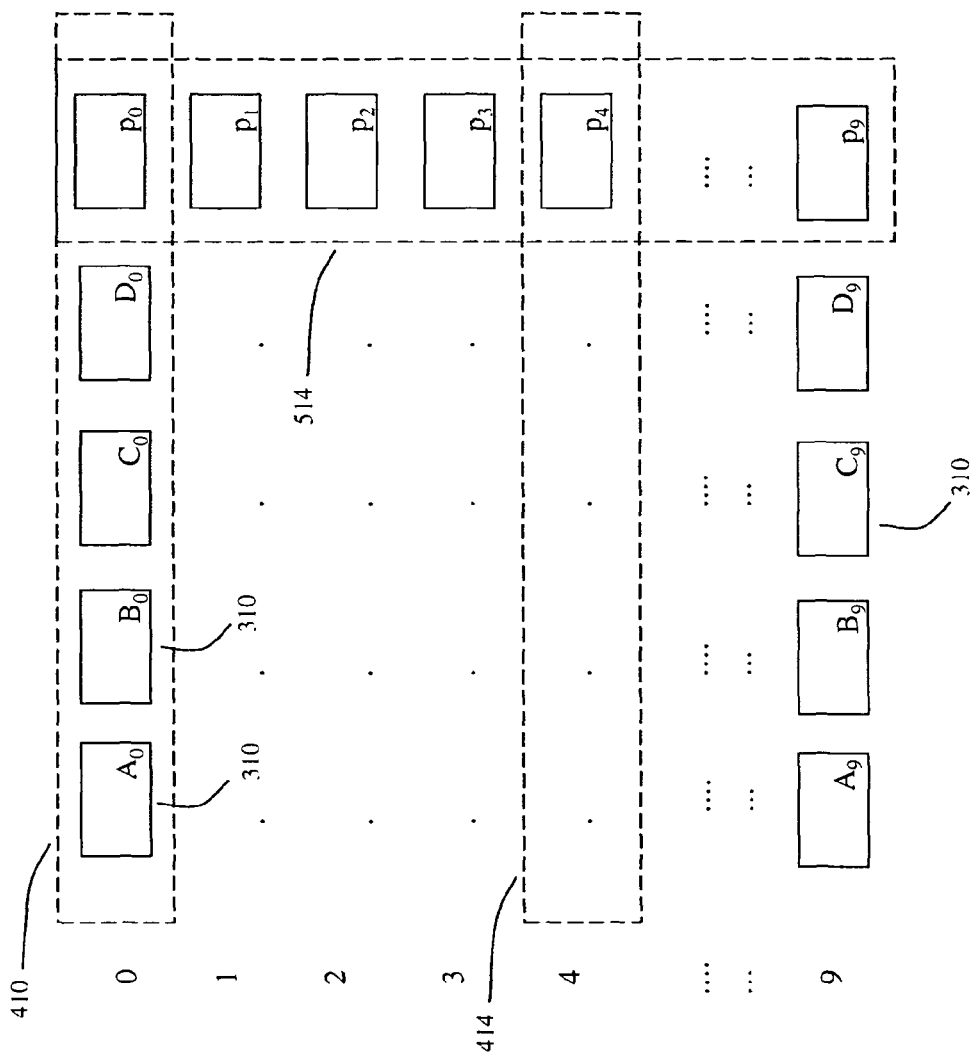
FIG. 5 is a schematic arrangement of the data in a RAID memory.

In another example, shown in FIG. 5, the management of a two dimensional array of data is shown. As previously mentioned, when the RAID-4 system was operated such that only one of the five memory modules A1-Ap was permitted to be in a write mode at any time, the four remaining of the memory modules promptly return data so that the latency for a read operation is not compromised for a write load of 20 percent or less. This situation contrasts with a system not having this constraint on the sequence of write operations, where the interference between read and write operations begins at a very low write load.

However, there may be situations where the write load is desired to be greater than 20 percent of the time line, yet the read latency is still desired to be as small as possible consistent with this situation. This may be accommodated by the management of the write operation over groups of stripes.

In describing the operation of this and other examples, the loading and response times of the memory module and system are varied so as to explain the principle of operation. For convenience, the time distribution of read and write requests is presumed to be uniform in time, and the average rate corresponding to a read or a write load. Also, over a short period of time, the loading is considered as a steady state value. The limitations of bus bandwidth and the like are ignored as, generally, the latency and response times of the memory modules is fairly long compared with the latency associated with bus transit time. Moreover, as various data areas in a memory system may experience different read and write loads due to, amongst other factors, the type of data stored, the application program accessing the data, and the like, the loading may vary at different stripes in the memory system, and the situation described may be considered to represent a local loading value rather than a global loading value. As such the adaptation of the memory may be on a local rather than a global basis. Coordination of operation, where needed, may be effected by a global or local timing algorithm, passing tokens, polling, signaling, or the like, or other methods of coordinating temporal operations in a computer or memory system.

The data in FIG. 5 is shown as organized in stripes, and a $0^{th}$ stripe 410 comprises memory modules 310 (or, for example, chips) A0, B0 C0, D0 and P0, arranged columns A, B, C, D, and P respectively. The remaining stripes of the system, 2-9, are similar, so as to form a memory system of 50 modules.

For purposes of explanation, a timing circuit on each memory module is considered to be initialized at the same time as on the other memory circuits, and marks time in intervals of 1 msec, which corresponds to time sufficient to complete at least one write or erase operation. Such write or erase operations are performed one column at a time in successive time intervals. FIG. 6A shows columns 514 of the memory modules being enable for writing operation in successive time intervals t1, t2, ... t10, and which repeat, modulo 10. As shown in FIG. 6B, where a time history of stripe 0 is shown, it may be seen that a single memory module is enabled for a write operation at any time period. This satisfies the criterion that 4 of the 5 memory modules in a stripe be available for a read operation at any time. This results in a latency dependent only of the read latency with no write load influence.

When the write load exceeds 20 percent, this strategy is not able to keep up with the amount of data that is desired to be written. Additional write periods need to be allocated. To the extent that they are allocated as needed, more than one memory module of a stripe may be in a write state at the time of a read request. As such, 4 of the 5 memory modules cannot promptly respond to the read request, and the read latency increases from a very small value (10s of microseconds) to at least about 1 msec, corresponding to the duration of the write state.

When discussing latency, and with a uniform arrival rate of requests, the latency is one half of the duration of the blockage due to the write state. However, for simplicity of explanation, the duration of the write state is used.

As the write load increases, the number of memory modules in a stripe that are in the write state at any time increases, and the latency may rise to the sum of the delays associated with the write states of the strip, perhaps to about 4 msec.

However, the maximum value of the write state may be limited to 1 msec, if all of the memory modules in a stripe 410 are caused to be in a write state at the same time. For example, when the write load exceeds 20%, in this example, but is less than 28%, each stripe may also be enable for a write operation every 10 time intervals. As such, in addition to a column (for example P in FIG. 5) a stripe 410 (stripe 0) may be enabled for the duration of the first time interval. In this strategy, all of the stripes are written to simultaneously, so that the total write time blockage is limited to 1 msec. As the write load increases, additional time intervals may be allocated for stripe writes. In particular, the strategy may space the stripe writes as far apart so possible in time. That is, the next increment may use both the first and the fifth time interval of a modulo 10 repetition.

The write load for the memory modules in a stripe may be expect to be about the same during any epoch, as, if at least pages are written, a write to one memory module would result in writing to all of the memory modules in the strip. Nevertheless, there will be differences in the write load, which may be due to writes of less than a page, or due to the housekeeping activities, which depend on the particular memory chips (due to bad blocks and the like).

Figure 7:
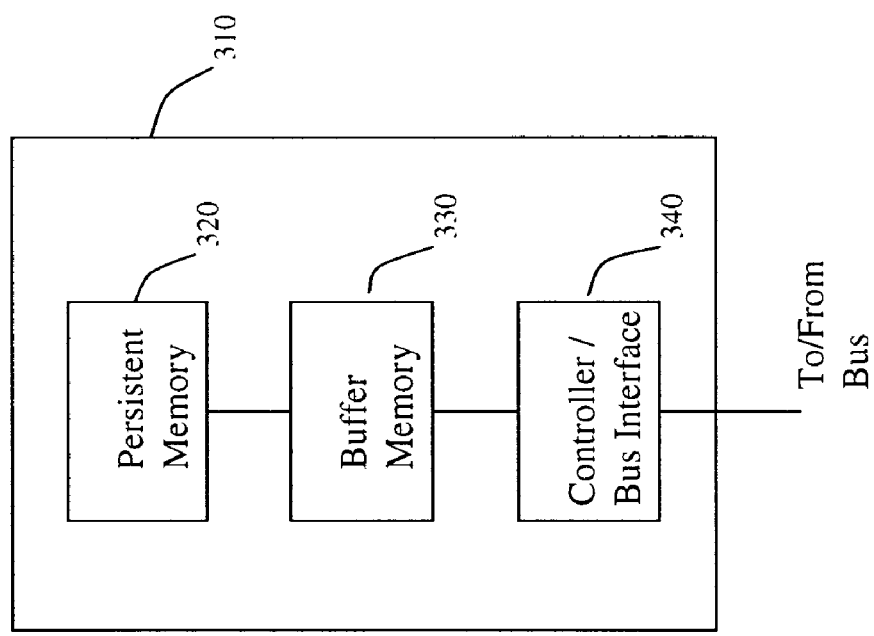
FIG. 7 is a block diagram of a memory module.

A memory module 310, as shown in FIG. 7 may include, for example, persistent memory 320, which may be FLASH memory, a buffer memory 330, which may be, for example, DRAM, and a controller/bus interface 340, which may be a configurable switching element (CSE) such as described in U.S. application Ser. No. 11/405,083, or other bus interface. The memory module may be capable of buffering input and output data and command, so that a memory module may maintain a queue of pending operations.

Operations that conflict with low latency reads, writes and erases, may be restricted to the time intervals designated for write operations. When a memory module timing slot permits a write operation, as many write or erase operations as may be performed in the time duration of the slot may be de-queued from the queue maintained in the controller 340 and performed. However, if there are no pending write or erase operations, pending read operations may be de-queued from a queue in the controller 340 and performed.

Alternatively, there may be write or erase operations remaining (for convenience, both are termed write operations here). Depending on the operating policy programmed, when additional write operations remain, this is taken as an indication that the write load has exceeded 20%, and that additional write periods may need to be allocated. Either the main memory controller is notified so as to throttle write operations to the stripe, or additional time slots are allocated to the write operation, until the queue is reduced to a nominal level, which may be either zero or a small number of pending operations. When allocating time slots to the write process, the time slots are spaced apart during the modulo 10 repetition of the pattern. As the write load increases and more write slots are needed, they become spaced closer together, however, a slot is left between successive writes for as long as possible. In this manner, the total length of any write blockage of a read request is minimized as the write load increases, and for less than about a 50% write load, the maximum blockage is only one write period. The time line available for reads is correspondingly reduced; however, high read loads and high write loads to the same stripe are likely to be transient in nature and have a small impact on overall system response time.

The policy of allocating additional write time blocks depending on a local queue permits the adaptation of the operation of each stripe to the read and write demands place upon it by the dynamic operation of the system.

In another aspect, when the individual modules in a stripe communicate with each other, for example, using a token passing construct, the token may represent a permission to perform a write interval. The token may be passed between the memory modules A-P of a stripe (for example, stripe 1) in sequence. When the token is held by A1, a write interval of, one write interval, which in this example is 1 msec is permitted. If there are write operations in the queue, those write operations which may be completed within that interval are executed. The token is then passed to B1 where the process is repeated; the token is continually passed, and when P1 has the token it is passed to A1, so that a round robin is performed.

Where write operations remain pending after completion of the write interval, this is an indication that the current write load exceeds the 20% value for which the read latency is transparent to writing. Absent other means of limiting the write load, the pending writes may have to be executed in the near future so as to avoid overflow of the buffer memory 330. In this circumstance, another write operation is performed after the token has been passed, which may allow at least one time interval between write intervals. The number of write intervals used during any round robin may thus vary with the write load, but the number of consecutive write intervals may be unity until the write load has become very high.

The allocation of time periods in which memory modules may perform their erase or program operations may be done in any number of ways: for example, allocating time periods with respect to a global reference time so that modules operate with local determination of the period of time, by the transmission of a control messages from a global controller, by token passing from module-to-module, by command buses or wires between the modules, or the like. A combination of approaches may be used: for example, in a system where when the desired programming data rate was greater than could be satisfied by having a single column of the RAID group performing programming at one time, and there were multiple RAID groups, then one module of some or all RAID groups may be programming or erasing while, at the same time for some number of RAID groups, more than one or all modules are programming or erasing as shown in FIG. 5. In such a system, for example, the column which may perform an erase or program may be determined by a fixed allocation of time periods, while the determination of when an entire row or RAID group may perform an erase or program operation may be determined by one of the modules in a RAID group sending a command to the next RAID group indicating the next RAID group can start, a form of token passing, and the module may have determined that all modules in its RAID group had completed their program or erase operation by use of a second token passing scheme, or a 'pull down' wire that all modules hold until they are done, or a command bus the other modules use to indicate they are done, or a similar method or configuration.

Where all time periods are non-overlapping then the latency effects of the erase or program operations may be completely hidden; where the time periods are only substantially non-overlapping the erase or program operation latency may be observable up to the time duration of the overlap. As long as the amount of time overlap is less than 100% then the apparatus and method may still result in reduced access time latency where compared with a fully overlapped erase and program operations.

As shown in FIG. 5, where some RAID groups perform a program or erase operation across more than one module, or all the modules in the group, the non-overlapping times are those of one RAID group with respect to the next RAID group, rather than from one module in a RAID group to the next module. The latency improvement here is not that of a single read access but if, for example, there are read accesses being made to all RAID groups, then only those accesses to RAID groups where more than one module is programming or erasing will experience increased latency, while accesses to those RAID groups only programming or erasing one module will not experience such an increase. As a result, the average latency over all the read accesses may be improved.

The approach may be applied to FLASH memory in other configurations, which may be removable or fixed. The approach described herein may be performed within a module itself providing that the module had a sufficient number of FLASH devices. The approach may thus be used independently at multiple levels in a memory architecture. For example, Solid State Disks (SSD) in the form factor of a standard hard drive interconnected by a disk access protocol such as SATA, SCSI, Fibre Channel, or other form factors or access protocols that are known or which may be developed. The correspondence between RAID groups and modules is such that there may not be a one-to-one correspondence of modules and "columns" of a RAID group. For example, where a "column" of a RAID group may be spread across more than one module, or where due to RAID reconstruction the data on a module may be in the process of being moved to a replacement module and, for some period of time, more than one module may contain a "column" of the RAID group, In another aspect, a RAID-6 organization may be superimposed on the RAID-4/5 where another parity computation is made on the columns of the data array. Alternatively, the additional parity computation may be made on the memory modules considered as a physical configuration. That is, without regard to the allocation of memory modules to stripes, the data in a column of a linear array of modules may be XORed so as to compute parity data. This may also be done in the case of a binary tree such as shown in FIG. 4A or 4B. For example, the data from the two memory modules in the tree may be XORed when received at the next higher level in the tree to create first parity data. Similarly this parity block may be XORed with the data at the receiving module to create a new parity block. As this is a binary tree, the two new parity blocks may be transmitted from their respective nodes to the next higher physical node in the tree, where the process of XORing may be again performed, and so on until the root of the tree, or some other higher level node is reached. This parity data may be used similarly to the column parity of a RAID-6 system so as to provide additional parity data in the event of a failure of more than one module. The propagation of the XOR parity data is limited to the amount of data needed for the data block itself at any level of the tree, and may be performed without a substantial bus load, and with the computations associated with the computation of XOR parity distributed over the memory modules in a substantially even manner.

Where the term memory module is used, the memory module may be, for example, a pluggable circuit card with a plurality of memory circuits thereon, or the memory module may be each one of, or a group of, memory circuits on the circuit card, or what is know as a Solid State Disk (SSD); SSDs come in many form factors, from individual cards to packages that may conform to the size and shape of a mechanical disk drive. The scale size of the logical address range that may associated with a memory module or storage location is not intended to be limited by the description herein, and a memory module may thus encompass both larger and smaller data storage devices or data structures.

Figure 8:
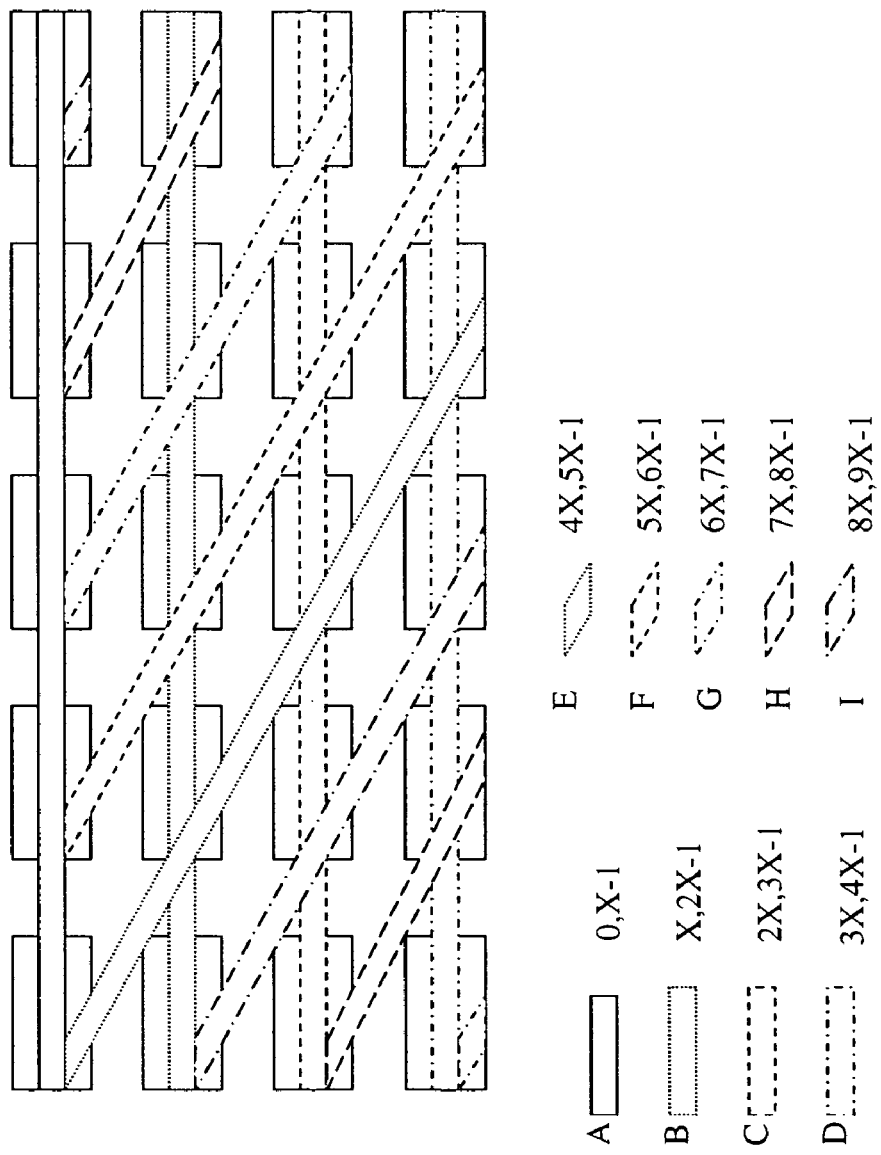
FIG. 8 shows a group of memory modules where each module belongs to more than one raid group, and the raid groups are striped in different ways across the modules.
Figure 9:
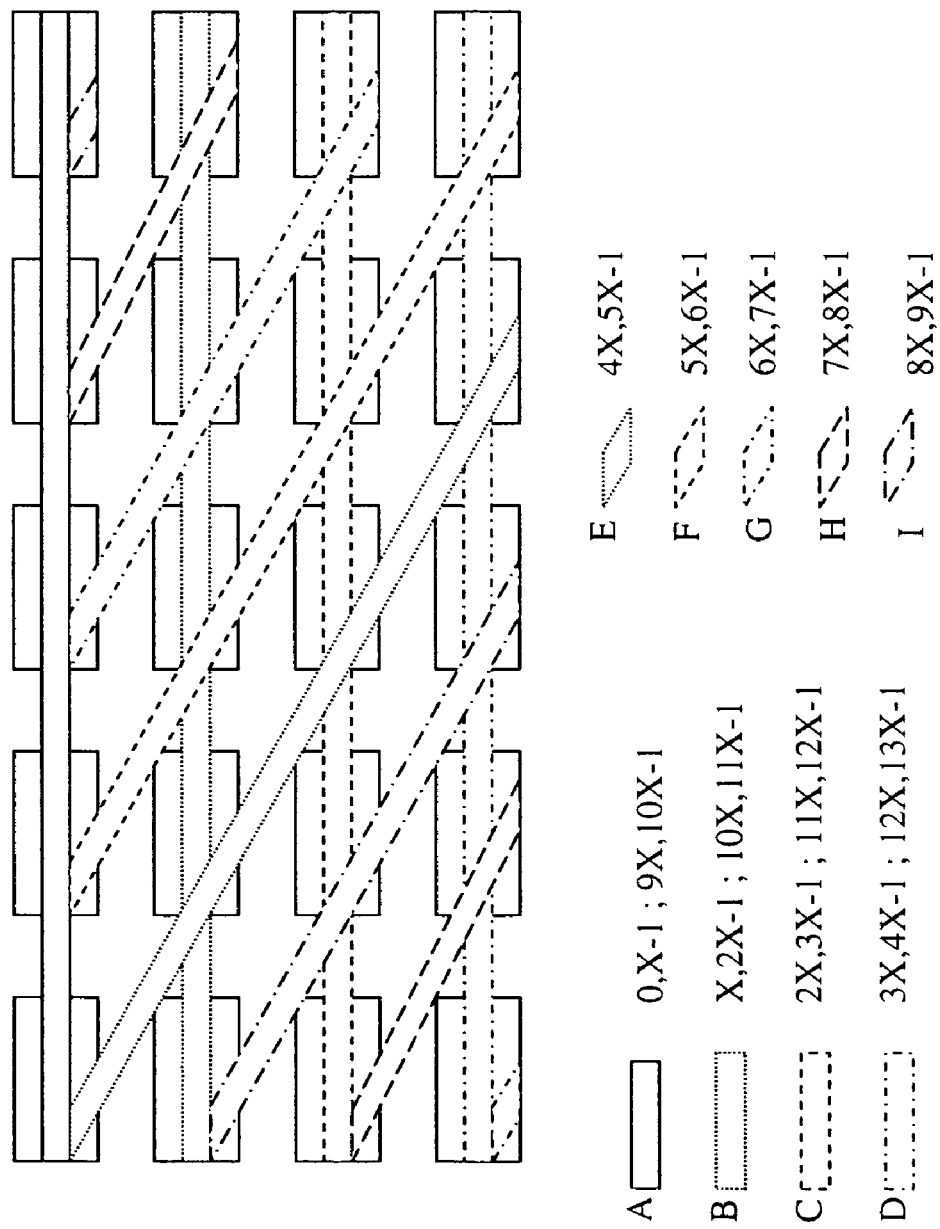
FIG. 9 shows a RAID arrangement where the sequence of addresses in a group may not be contiguous.

As an example FIG. 8 shows a group of modules where not only does each module belong to more than one raid group, but the raid groups are striped in different ways across the modules. For example, RAID groups A, B, C, D are stripped horizontally, with each stripe containing X addresses, stripe A has addresses 0 to X−1, B has X to 2X−1, as so on, while groups E, F, G, H, I are stripped diagonally, each group also containing X addresses. FIG. 9 shows that the number of addresses in a group need not be contiguous, or identical to other groups. In this example, after the last address in group I the addressing wraps around to start with group A, which has address 0 to X−1 and 9X to 10X−1.

While FIGS. 8 and 9 show layouts that are uniform and regular, there is no requirement that the RAID stripes be regular or uniform, as an example the ZFS file system makes every piece of data written its own RAID stripe which may be placed on any set of modules in a storage system as described herein.

In an aspect, the data of a RAID stripe is divided into a plurality of groups of data. A parity is computed as the exclusive-OR (XOR) of the plurality of groups of data. The groups of data and the parity are written to a RAID stripe. The parity data may be distributed amongst the memory modules of the RAID stripe, or written to a memory module of the RAID stripe separate from the data. When the RAID stripe is read, and the RAID stripe has M memory modules, the data from the first M−1 memory modules may be used to determine the data that has been stored in the RAID stripe. When the memory modules of a RAID stripe are managed such that a write or erase operation can be performed on only one of the modules at a time, a read operation sufficient to recover the stored data may be performed without waiting for the completion of any write or erase operation.

The foregoing examples generally use the term module to represent a physical memory circuit, or a logical or physical address range, which may be a single address location, or distributed over a range of physical or logical locations. Memory circuits on a physical module may be grouped so as to be part of different RAID stripes, and have different time periods during which reading and writing and erasing may occur. As such, the use of the term module is a matter of convenience and is not intended to suggest or require a specific arrangement. Similarly, it would be understood that sub-optimum throughput configurations may be selected for other reasons, and may be mixed with the configurations described herein where desirable.

It is therefore intended that the foregoing detailed description be regarded as illustrative rather than limiting, and that it be understood that it is the following claims, including all equivalents, that are intended to define the spirit and scope of this invention

What is claimed is:

1. A memory system, comprising:
a plurity of memory modules, each module having a FLASH memory circuit capable of writing data and reading data,
wherein data, and error correcting code data for the data, are written as a RAID stripe in a group of N memory modules of the plurality of memory modules and each module of the group of N memory modules is configured such that data is written to, or erased from, the module during a time period s, where a time period s of each of the N modules does-not fully overlap a time period s of another of the N modules.

2. The memory system of claim 1, wherein the time periods do not substantially overlap.

3. The memory system of claim 1, wherein the time periods of any two modules do not overlap by more than half of the time period.

4. The memory system of claim 1, wherein when the data received from N−1 memory modules includes error correcting code data, data recoverable by computing an exclusive-OR (XOR) of the data from the N−1 modules.

5. The memory system of claim 1, wherein the error correcting code data is computed as the exclusive-OR (XOR) of the stored data.

6. The memory system of claim 1, wherein the time periods are non-overlapping.

7. The memory system of claim 5, wherein the error correcting code data is distributed over the N memory modules.

8. A memory system, comprising:
a plurality of memory modules, each module having FLASH memory circuit and a timing circuit, and; and
a group K of the memory modules configured to store data including parity data, where K is a RAID stripe,
wherein each of the K memory modules is allocated a substantially non-overlapping time interval in which data may be stored to, or an erase operation performed on, the memory modules of the K memory modules.

9. The memory system of claim 8, wherein the data received at a memory controller from any K−1 of the K memory modules of the RAID stripe may be used to represent the stored data.

10. The memory system of claim 8, wherein the data and the parity data are distributed over the group of K memory modules.

11. The memory system of claim 8, wherein the data from any K−1 of the K memory modules of the RAID stripe may be used to represent the stored data including the parity data.

12. The memory system of claim 8, further comprising a memory controller communicating with the memory modules using a bus.

13. The memory system of claim 8, wherein the time interval is at least the greater of an erase time or a write time.

14. The memory system of claim 1, where the overlap of the time periods depends on the write or erase load of a RAID stripe.

15. The memory system of claim 1, when data is received from any N−1 modules of the group of N memory modules, the data stored in the group of N memory modules is recoverable.

16. The memory system of claim 4, wherein the data is received by a memory controller.

17. The memory system of claim 1, wherein the memory module is at least one of an electronic circuit or a physical address range.

18. The memory system of claim 1, wherein the memory module is a logical address range.

19. The memory system of claim 11, wherein, the parity data is XORed with data from the K−1 memory modules to reconstruct missing data.

20. The memory system of claim 8, wherein when more than a predetermined number of write or erase operations are pending for a memory module, an another time interval is also used to perform a write or erase operation.

21. The memory module of claim 20, wherein the another time interval is offset by a different number of time intervals from the time interval at each memory module of the group of K memory modules.

22. The memory module of claim 20, wherein the another time interval of each memory module of the K memory modules coincide in time.

* * * * *

UNITED STATES PATENT AND TRADEMARK OFFICE
CERTIFICATE OF CORRECTION

PATENT NO. : 8,200,887 B2
APPLICATION NO. : 12/079364
DATED : June 12, 2012
INVENTOR(S) : John C. R. Bennett It is certified that error appears in the above-identified patent and that said Letters Patent is hereby corrected as shown below:

In column 19, claim 1, line 33, before "of memory modules," replace "plurity" with --plurality--.

In column 19, claim 1, line 42, after "the N modules" replace "does-not" with --does not--.

In column 19, claim 4, line 51, before "recoverable by computing" insert --is--.

In column 20, claim 8, line 5, after "timing circuit, and;" delete "and".

Signed and Sealed this
Twenty-third Day of October, 2012

David J. Kappos
*Director of the United States Patent and Trademark Office*